United States Patent [19]

Lohrmann

[11] 4,348,649

[45] Sep. 7, 1982

[54] MICROWAVE POWER PULSE GENERATOR

[75] Inventor: Dieter R. Lohrmann, Lanham, Md.

[73] Assignee: The United States of America as represented by the Secretary of the Army, Washington, D.C.

[21] Appl. No.: 176,319

[22] Filed: Aug. 8, 1980

[51] Int. Cl.³ .............................................. H03K 3/05
[52] U.S. Cl. ...................................... 331/96; 307/108; 331/151; 331/165; 331/174
[58] Field of Search ................. 331/96, 104, 143, 151, 331/165, 173, 174, 79–82; 307/106, 108; 328/66, 67, 252

[56] References Cited

U.S. PATENT DOCUMENTS 2,706,786 4/1955 White .................................. 331/96 X Primary Examiner—Siegfried H. Grimm
Attorney, Agent, or Firm—Nathan Edelberg; Robert P. Gibson; Saul Elbaum

[57] ABSTRACT

A self-pulsing microwave generator with a quarter-wave resonator separated by an electron transit space from a field emission cathode is provided. The quarter-wave resonator acts as an anode and a DC voltage is supplied by a discharge capacitor and a DC current source. The application of DC voltage to the resonator causes the resonator to resonate at a selected frequency dependent upon the size and characteristic of the resonator. The discharge capacitor is discharged by the resonator-cathode combination until the voltage drops below the field emission threshold voltage of the cathode at which time the pulse terminates. The resonator is in the shape of a cone to decrease the interelectrode capacitance.

8 Claims, 7 Drawing Figures

MICROWAVE POWER PULSE GENERATOR

RIGHTS OF THE GOVERNMENT

The invention described herein may be manufactured, used or licensed by or for the Government of the United States of America for governmental purposes without payment to me of any royalties thereof.

BACKGROUND OF THE INVENTION

This invention is related to microwave power generators generally, and more particularly to a vacuum vessel microwave generator that is self-pulsing, self-oscillatory, simple, lightweight, and exhibits high peak power.

In the design of radar proximity fuzes and other small devices that require microwave power generation, it is desired to have a generator that is lightweight, small, of simple construction for high reliability, that has low power consumption and high peak power output. At present, semi-conductor devices are used, such as the IMPATT oscillator. However, the power output of these semi-conductor devices is limited to the order of watts with a low D.C. to microwave power conversion efficiency of approximately five percent in pulsed operation.

One of the major problems with the use of low power semi-conductor devices in radar proximity fuzes is that if high power electronic countermeasures are employed the low power devices are overpowered. This can either negate or lessen the effectiveness of the fuze.

Other microwave generators such as the magnetron, shown in the prior art, have a high peak power output. However, these devices are generally bulky and complex. For example, the magnetron requires power to heat the cathode and requires a magnet. Other devices require wave guides, multiple electrodes, multiple voltage inputs or another source of rf power. These factors make the devices bulky, heavy and/or high power consumers.

It is therefore one object of this invention to provide a microwave generator that exhibits high rf peak power output and requires no magnet.

It is another object of this invention to provide a microwave generator that is self-pulsing requiring no external switching or pulsing circuit.

It is a further object of this invention to provide a microwave generator that is lightweight and simple in construction.

It is still another object of this invention to provide a microwave generator that is self-oscillatory requiring no external source of pulsing energy.

It is still a further object of this invention to provide a microwave generator that has high conversion efficiency thereby decreasing power requirements.

Other objects, advantages and novel features of the present invention will become apparent from the following detailed description of the invention when considered in conjunction with the accompanying drawings.

SUMMARY OF THE INVENTION

These and other objects, features, and advantages of the invention are accomplished by a new type of microwave generator comprising a quarter wavelength resonator which acts as an anode separated by a transit space from a field emission cathode. The resonator and cathode are enclosed in a high vacuum vessel. The vessel is penetrated by electrical leads which supply DC voltage to anode and cathode. The vacuum vessel is also penetrated by means to couple out the rf energy. The DC voltage is supplied by a discharge capacitor which is charged by a DC current generator.

BRIEF DESCRIPTION OF THE DRAWINGS

The above and further objects and novel features of the invention will more fully appear from the following description when the same is read in connection with the accompanying drawings. It is to be understood, however, that the drawings are for the purpose of demonstration only, and are not intended as a definition of the limits of the invention.

FIG. 3($b$) is a graphical representation of the voltage waveform found at the resonator tip.

DESCRIPTION OF THE PREFERRED EMBODIMENT

Figure 1:
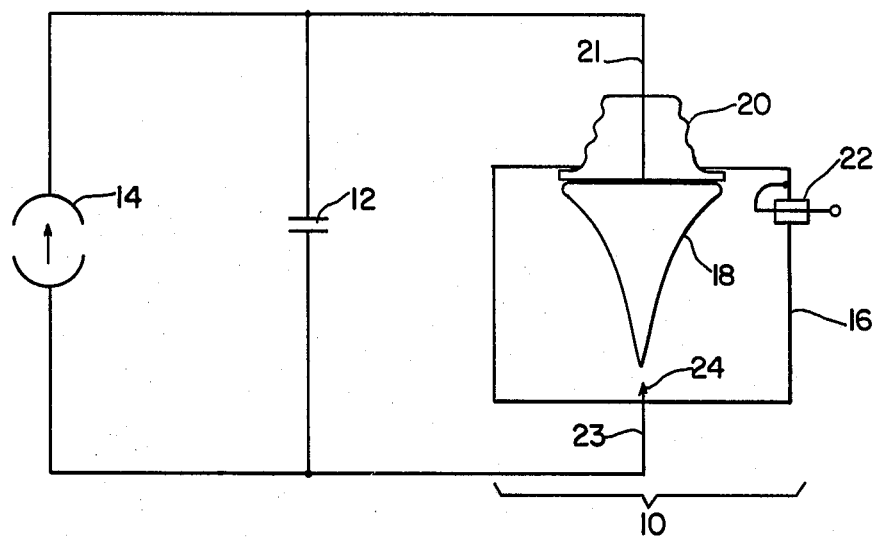
FIG. 1 is a schematic of the microwave generator.
Figure 2:
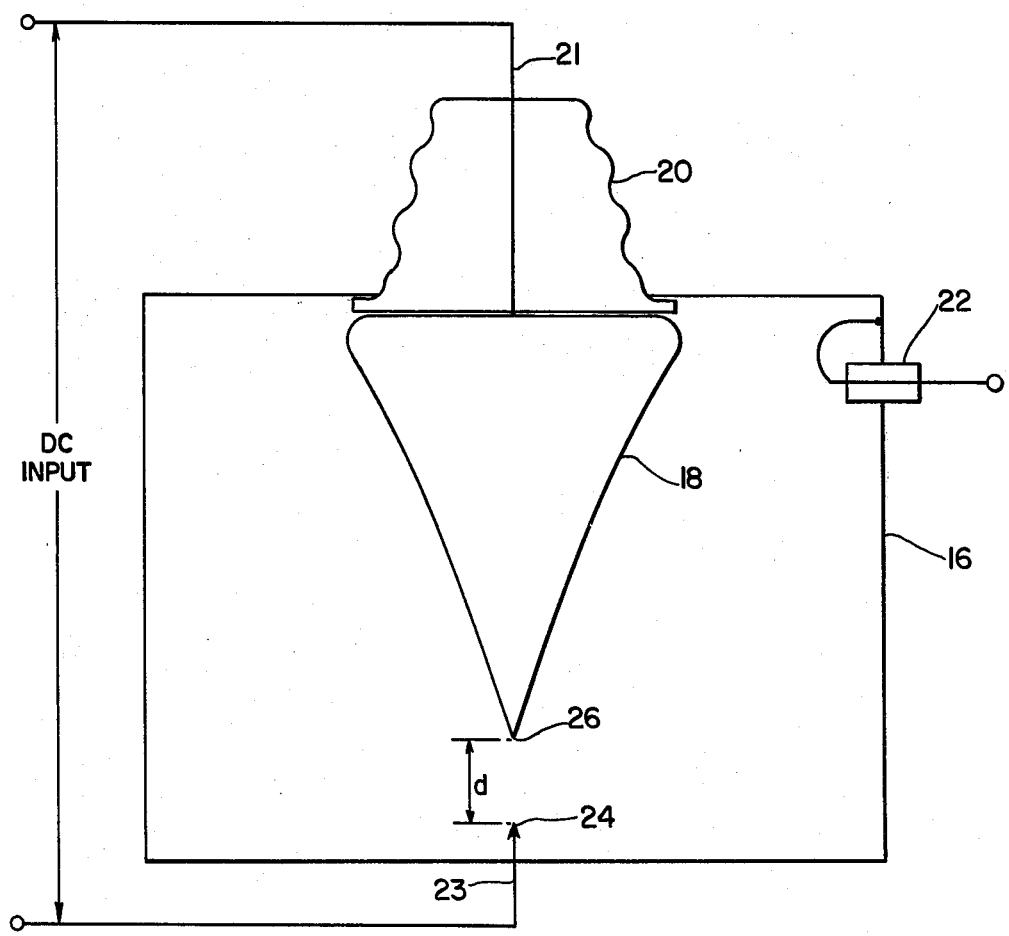
FIG. 2 is a schematic of the resonator, field emission cathode and the vacuum vessel.

Referring now to the drawings, wherein like reference characters designate like or corresponding parts throughout the several views, FIGS. 1-2 are schematic representations of the present invention. A quarter wave resonator 18 and a field emission cathode 24 are enclosed within the vacuum vessel 16. The vacuum vessel 16 is shown in the shape of a rectangle, however, the vacuum vessel can be of different shapes. A means 22 is provided to couple out rf energy, an example of which could be a capacitive probe, an inductive loop or a waveguide window. The insulator 20 insulates the resonator 18. Electrical lead 21 penetrates the insulator 20 and serves to connect the resonator 18 with discharge capacitor 12 and DC current generator 14. The opposite sides of discharge capacitor 12 and DC current generator 14 are connected to the field emission cathode 24 by electrical lead 23. In the preferred embodiment, generally shown in FIG. 2, the quarter wavelength resonator is shaped as a cone with the tip 26 pointing towards the tip of the field emission cathode 24. The size and characteristics of the resonator 18 are chosen to provide the desired frequency. The distance between the tip 26 of the resonator 18 and the field emission cathode 24 is designated as d. The determination of distance d will be explained in conjunction with FIGS. 3-5. The shape of the resonator 18 as disclosed in FIG. 2 minimizes the capacitance between the resonator 18 and the cathode 24.

Figure 3A:
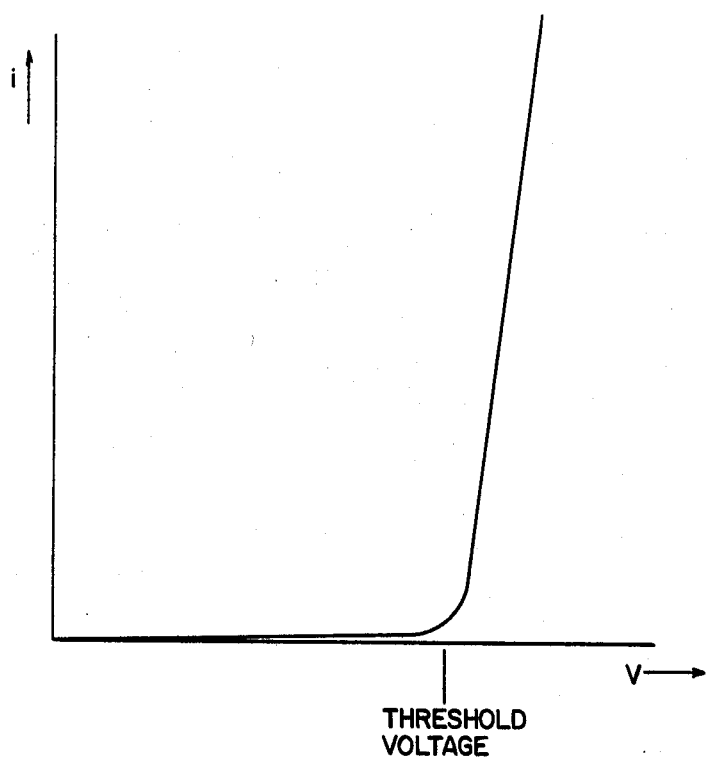
FIG. 3($a$) is a graphical representation of the typical voltage-current characteristic of a field emission cathode.
Figure 3B:
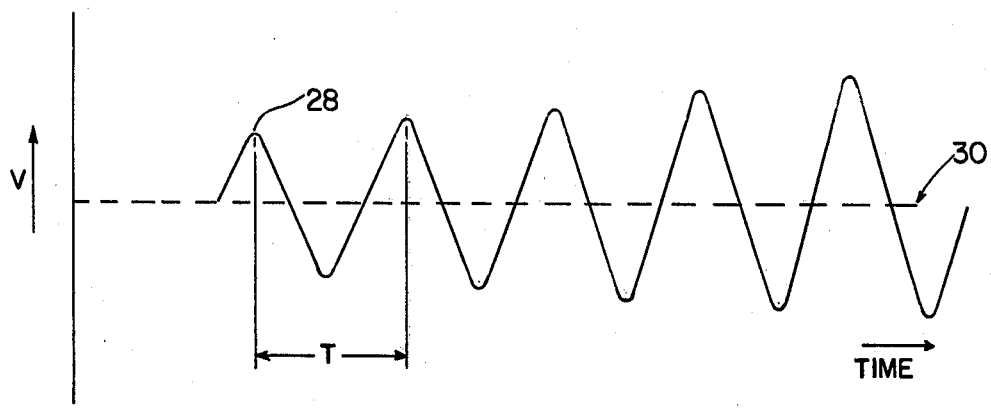
Figure 4:
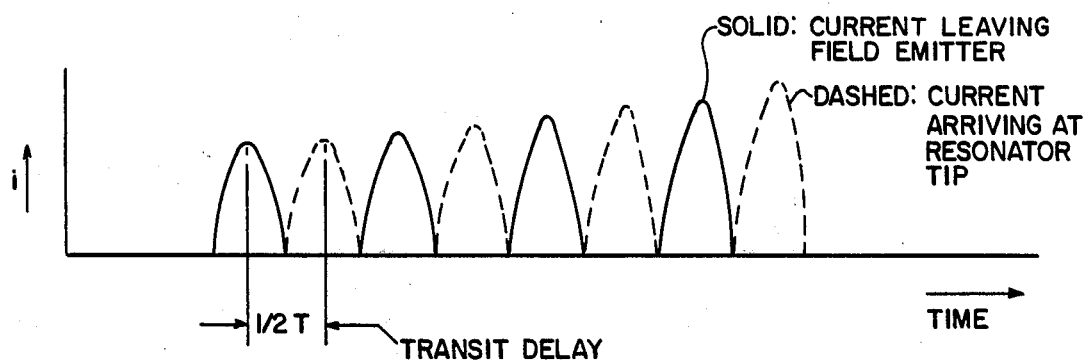
FIG. 4 is a graphical representation of the current leaving the field emitter and arriving at the resonator tip.
Figure 5:
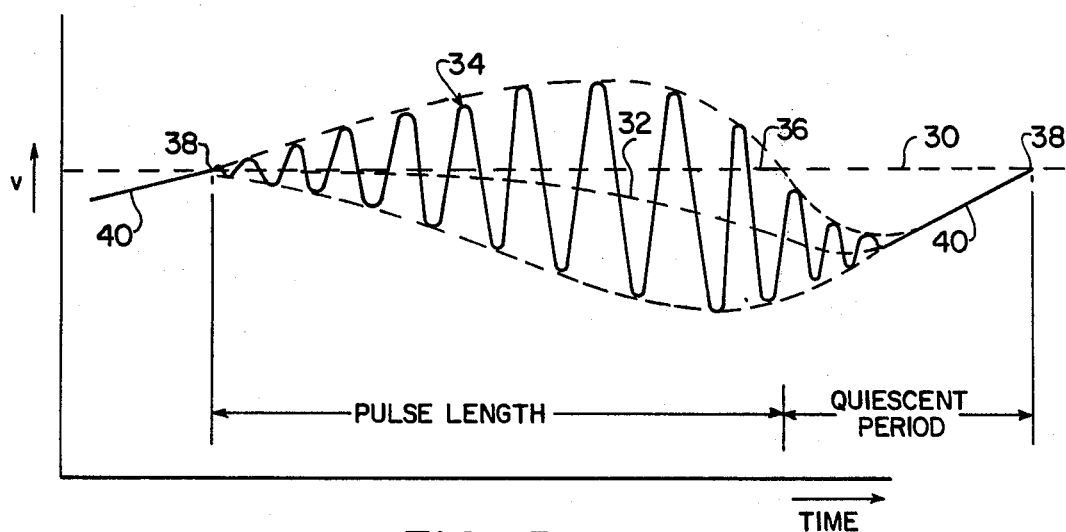
FIG. 5 is a graphical representation of the voltage at the resonator tip during the pulse and quiescent period.

The operation of the microwave generator will be explained in conjunction with FIGS. 3-5. The DC current generator 14 supplies charge to discharge capacitor 12. At the same time the DC voltage is seen at the resonator 18. The current-voltage characteristics, FIG. 3($a$) of the field emission cathode is a key feature in the functioning of the device. As the DC voltage on the resonator increases from zero, no DC current will flow from the field emission cathode, until the threshold voltage is reached. As the voltage increases further, a very steep increase of the DC current is observed.

Once the charge on discharge capacitor 12 reaches the field emission threshold voltage of field emission cathode 24, electrons will be emitted from the field emission cathode 24 and will be drawn towards the resonator 18 which acts as an anode. The resonator which is chosen to resonate at a given frequency will then begin to oscillate at that frequency. The oscillation will start rising out of thermal or current flicker noise in the well known exponential fashion. However, for the purpose of a basic physical explanation, assume that the rf voltage has already reached a considerable amplitude, FIG. 3(b). FIG. 3(b) graphically illustrates the voltage waveform 28 seen at the resonator tip 26 and shows the rf voltage superimposed on a DC voltage representated by 30 which is also the field emission threshold. The value T is the period of the rf frequency which is a function of the resonator characteristics chosen. As can be seen from FIG. 3(b) the voltage waveform 28 at the resonator tip 26 during the positive half-cycle is above the field emission threshold and is below the field emission threshold during the negative half-cycle. Therefore, only current is drawn from the field emission cathode 24 during each positive half-cycle. FIG. 4 is a graphical representation of the current leaving the field emitter 24 shown in solid outline and the current arriving at the resonator tip shown in dashed outline. The transit delay is defined as the time it takes the electrons emitted from cathode 24 to travel the distance d to the resonator tip 26. If the distance d is chosen so that the transit delay is equal to one-half T, the current leaving the field emitter will arrive at the resonator tip during the negative cycle of the voltage waveform 28 shown in FIG. 3(b). The electrons arriving at the resonator tip 26 thus increase the negative swing of the voltage at the resonator tip 26, therefore increasing the amplitude of the AC swing on the resonator. This gain of amplitude causes the exponential rise of the rf signal until effects of nonlinearity limit the amplitude. The available rf power is then coupled out through coupling element 22, FIGS. 1 and 2.

The oscillator turns itself on and off in a repetitive fashion, thus creating periodic rf pulse packages such as are customarily used in pulsed radars. FIG. 5 is a graphical representation of the pulse length and quiescent period waveform of the generator and is shown in contracted form. Straight line 40 represents the voltage build-up on discharge capacitor 12. This voltage increases until the point indicated at 38 is reached wherein the oscillations begin and are shown as waveform 34 which corresponds to the voltage waveform 28 shown in FIG. 3(b). At this time, because of the current drain, the voltage of discharge capacitor 12 begins to decrease and is represented by line 32. At some point, represented by point 36, the generator will begin to cut off because the positive half-cycle falls below the field emission threshold represented by the dashed line 30 shown in FIG. 5. Once the generator is cut off, the discharge capacitor 12 will again begin to accumulate charge represented by line 40. It can also be appreciated that the pulse length and the quiescent period is dependent upon the size of the capacitor 12, thus, the pulse length and quiescent period can be selected by selecting the size of discharge capacitor 12.

Figure 6:
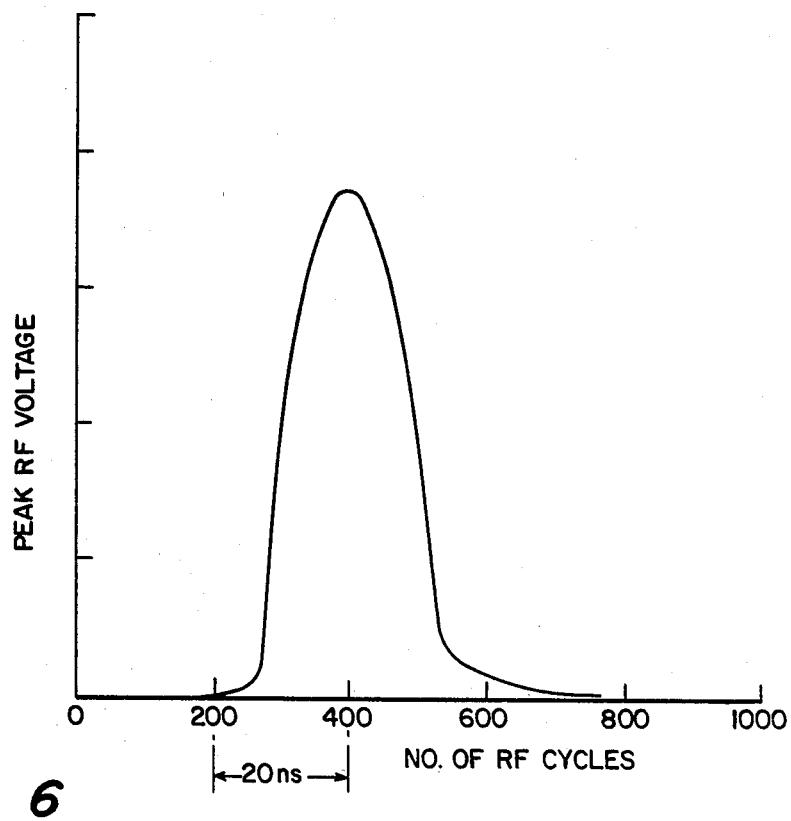
FIG. 6 is a graphical representation of the rf pulse envelope.

An alternative embodiment is disclosed using a thin film field emission cathode which uses arrays of molybdenum cones. Up to 5,000 cones per cathode can be used which reduces the fluctuation noise because of the averaging effect. For such an arrangement, the values shown in Table 1 were calculated and the results were simulated on the computer and shown in FIG. 6.

TABLE 1

| Frequency in rf pulse | 10 GHz |
| Pulse Repitition Rate | 1 MHz |
| Pulse Duration | 10 ns |
| Peak rf Power | 1 kW |
| Discharge Capacitor | 10 pF |
| DC Charging Current | 25 mA |
| Field Emission Threshold Voltage | 3.5 kV |

While the invention has been described with reference to the accompanying drawings, it is to be clearly understood that the invention is not to be limited to the particular details shown therein as obvious modifications may be made by those skilled in the art. The embodiments of the invention should only be construed within the scope of the following claims.

What I claim is:

1. A self-pulsing microwave generator comprising:
a means for emitting electrons at a threshold potential;
a resonator means for producing oscillations at an rf frequency comprising a quarter-wavelength resonator shaped to minimize the interelectrode capacitance between said resonator means and said means for emitting electrons;
an electron transit space between said resonator means and said means for emitting electrons; and
a DC voltage means for producing a time variant potential between said resonator means and said means for emitting electrons.

2. A self-pulsing microwave generator as recited in claim 1 further comprising;
a vacuum vessel enclosing said resonator means, said means for emitting electrons and said electron transit space;
insulating means for insulating said resonator means from said vacuum vessel;
means for penetrating said vacuum vessel for applying said DC voltage means to said resonator means and said means for emitting electrons; and
means penetrating said vacuum vessel for coupling rf energy to an output.

3. A self-pulsing microwave generator as recited in claim 2 wherein said resonator means is in the shape of a cone with the tip of said resonator cone pointing towards said means for emitting electrons.

4. A self-pulsing microwave generator as recited in claim 3 wherein said means for emitting electrons at a threshold potential comprises a field emission cathode.

5. A self-pulsing microwave generator as recited in claim 4 wherein said DC voltage means comprises:
a capacitor connected in parallel across said resonator means and said means for emitting electrons, for providing an increasing voltage difference between said resonator means and said means for emitting electrons; and
a DC current source connected in parallel across said capacitor so that said resonator means is positive with respect to said electron emitting means, for supplying electrical charge to said capacitor.

6. A self-pulsing microwave generator as recited in claim 5 wherein said electron transit space is dimensioned so that the electrons emitted during the positive cycle of the voltage oscillations on said resonator means arrive at said resonator means during the negative cycle of the voltage oscillations on said resonator means.

7. A self-pulsing microwave generator as recited in claim 6 wherein said field emission cathode comprises a multitude of cone shaped electron emitting material with the tips of said cones pointed toward said resonator means.

8. A self-pulsing microwave generator as recited in claim 7 wherein said cone shaped electron emitting material is molybdenum.

* * * * *